United States Patent
Curran

[19]

[11] Patent Number: 5,939,915
[45] Date of Patent: Aug. 17, 1999

[54] NOISE-IMMUNE PASS GATE LATCH

[75] Inventor: Brian W. Curran, Saugerties, N.Y.

[73] Assignee: International Business Machines Corporation, Armonk, N.Y.

[21] Appl. No.: 08/907,346

[22] Filed: Aug. 6, 1997

[51] Int. Cl.⁶ ........................ H03K 3/037; H03K 3/289
[52] U.S. Cl. ........................................ 327/202; 327/203
[58] Field of Search ................................. 327/202, 203, 327/208–212, 214, 218

[56] References Cited

U.S. PATENT DOCUMENTS

| | | | |
|---|---|---|---|
| 4,967,108 | 10/1990 | Lee et al. | 364/724.01 |
| 4,974,241 | 11/1990 | McClure et al. | 327/208 |
| 5,059,836 | 10/1991 | Lee et al. | 364/724.01 |
| 5,081,377 | 1/1992 | Freyman | 327/203 |
| 5,459,421 | 10/1995 | Shaw | 327/203 |
| 5,465,060 | 11/1995 | Pelella | 327/51 |

FOREIGN PATENT DOCUMENTS

| | | | |
|---|---|---|---|
| 59-17719 | 1/1984 | Japan | 327/208 |
| 4-2212 | 1/1992 | Japan | 327/203 |

*Primary Examiner*—Tuan T. Lam
*Attorney, Agent, or Firm*—Lynn L. Augspurger

[57] ABSTRACT

A non-buffered, noise-immune transmission gate latch for high performance applications is disclosed. The latch data input circuit contains an additional PFET for pulling up the gate of a transmission PFET and an additional NFET to pull down the gate of the transmission NFET to prevent the transmission gate from inadvertently opening when noise is coupled into the data input node. When data input voltage rises to Vdd+Vtp, the additional PFET begins to turn ON, and an inverted clock node is pulled above Vdd. The higher inverted clock node voltage is coupled to the gate of the transmission PFET and thereby prevents the transmission PFET from inadvertently turning ON. When data input voltage drops to −Vtn, the additional NFET begins to turn ON, and a clock node Is pulled below ground. The lower clock node voltage is coupled to the gate of the transmission NFET and thereby prevents the transmission NFET from inadvertently turning ON. Thus two additional transistors provide the necessary noise immunity.

15 Claims, 3 Drawing Sheets

NOISE-IMMUNE PASS GATE LATCH

FIELD OF THE INVENTION

This invention is related to a high speed logic circuits, and particularly to a noise-immune pass gate latch for use in CMOS chips.

GLOSSARY OF TERMS

While dictionary meanings are also implied by certain terms used here, the following glossary of some terms may be useful.

| | |
|---|---|
| FET | Field Effect Transistor |
| PFET | P-type FET |
| NFET | N-type FET |
| Vtp | PFET threshold voltage or gate-to-source voltage at which PFET begins to conduct. |
| Vtn | NFET threshold voltage or gate-to-source voltage at which NFET begins to conduct. |

BACKGROUND OF THE INVENTION

A latch circuit operates as a digital sample and hold circuit. It has two inputs, a data input and a clock. Information presented at the data input is transferred to the output when the clock goes high. When the clock goes low, the information that was present at the data input at the time the clock transition occurred is retained at the output. Thus, the trailing edge of the clock samples the data line and the circuit holds (stores) the binary information at the transition. Hence, this circuit is common in many digital circuits and widely used for many applications.

One of the fastest known CMOS latch implementations is a transmission gate latch, but unfortunately this latch design is sensitive to coupled or other forms of noise induced on the data input node. It would be desirable to provide a fast, but noise immune static latch for the purposes for storing digital signals.

SUMMARY OF THE INVENTION

We have created a new compact high performance latch design which is particularly suited to manufacture and use in latching of noisy signals. Our latch circuit contains a PFET and NFET which couple noise from the data input onto the gates of the transmission FETs.

These and other improvements are set forth in the following detailed description. For a better understanding of the invention with advantages and features, refer to the description and to the drawings.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION OF THE INVENTION

Before fully understanding our invention, the reader will need to refer to the latch circuit provided by the prior U.S. Pat. No. 5,465,060 and so we will first describe FIG. 1 which illustrates the unsatisfactory transmission gate design.

Figure 1:
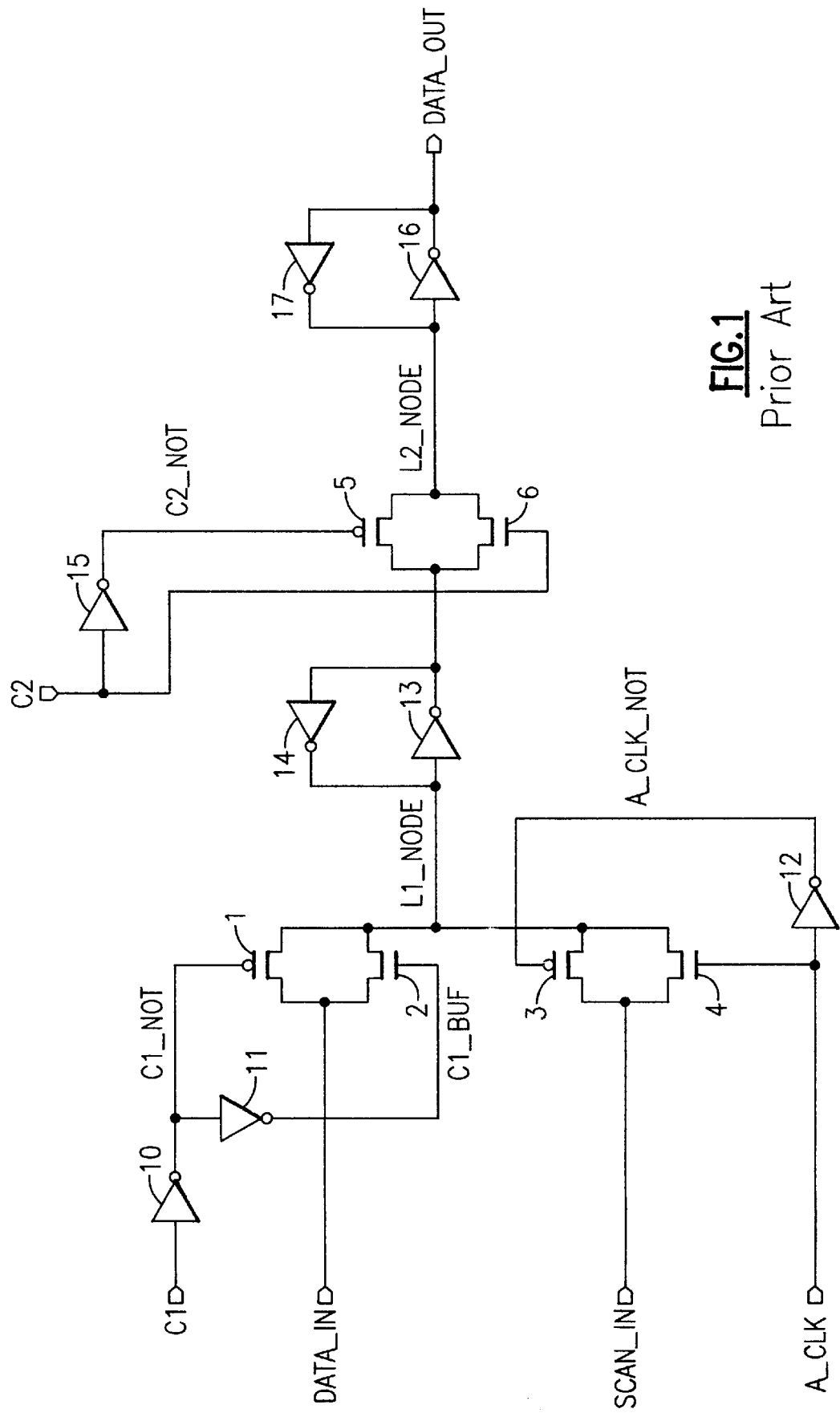
FIG. 1 is a typical transmission gate design which is not satisfactory for our purposes.

Referring to FIG. 1, a fast CMOS latch implementation known as a transmission gate design is unsatisfactory because this latch design is sensitive to coupled or other forms of noise induced on the data input (data_in) node. If the data input voltage exceeds Vdd+Vtp or drops below −Vtn the transmission gate will inadvertently be forced ON, and can cause the latch to flip state.

Figure 2:
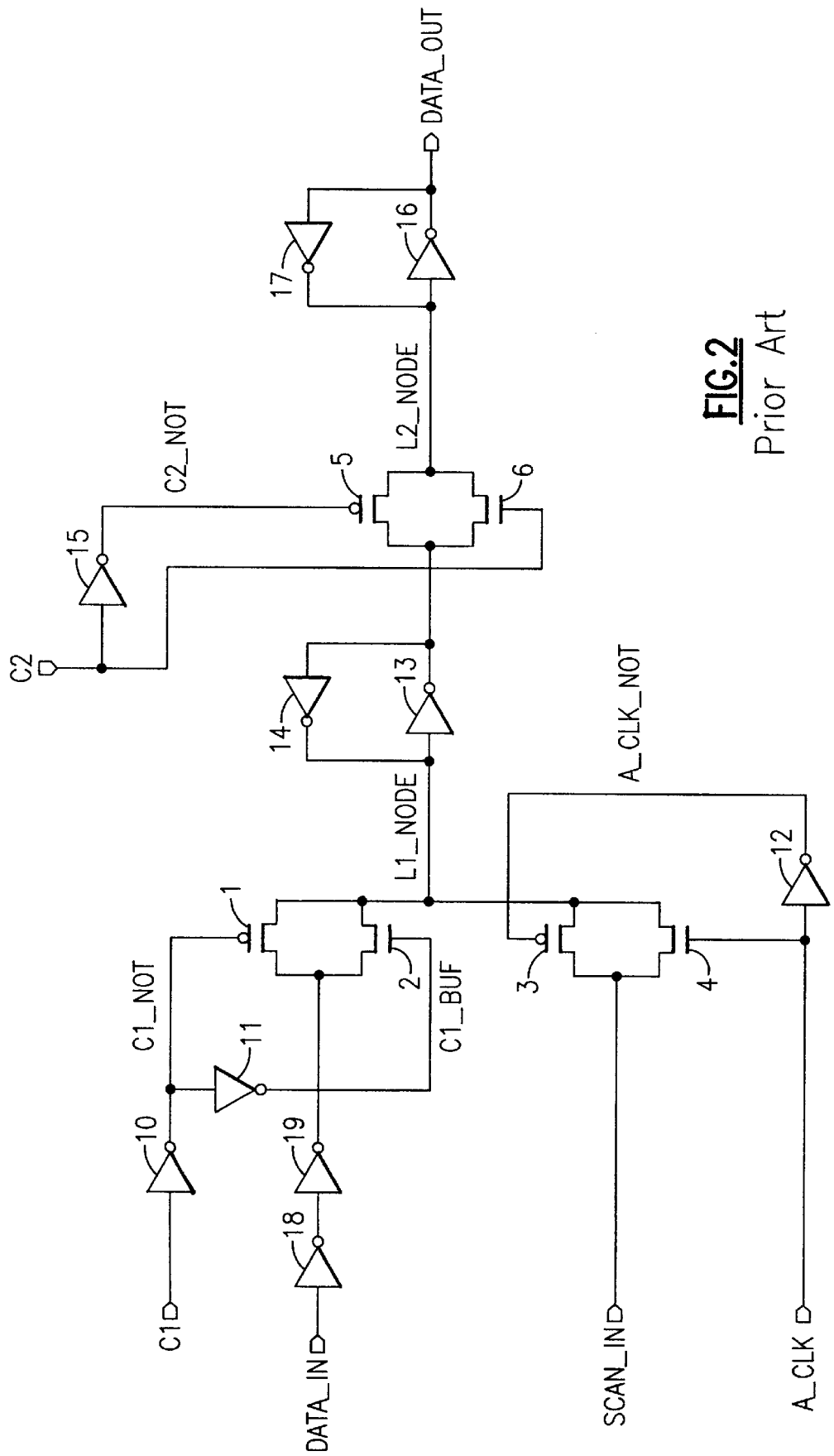
FIG. 2 is a schematic logic diagram of an idea which could be used for a latch design with a buffer, which is also not satisfactory for our purpose.

One solution is shown in FIG. 2 as a schematic logic diagram of an idea which could be used for a latch design with a buffer, which is also not satisfactory for buffering the latch input as shown in this diagram adds extra delay in the paths which end at the latch.

Figure 3:
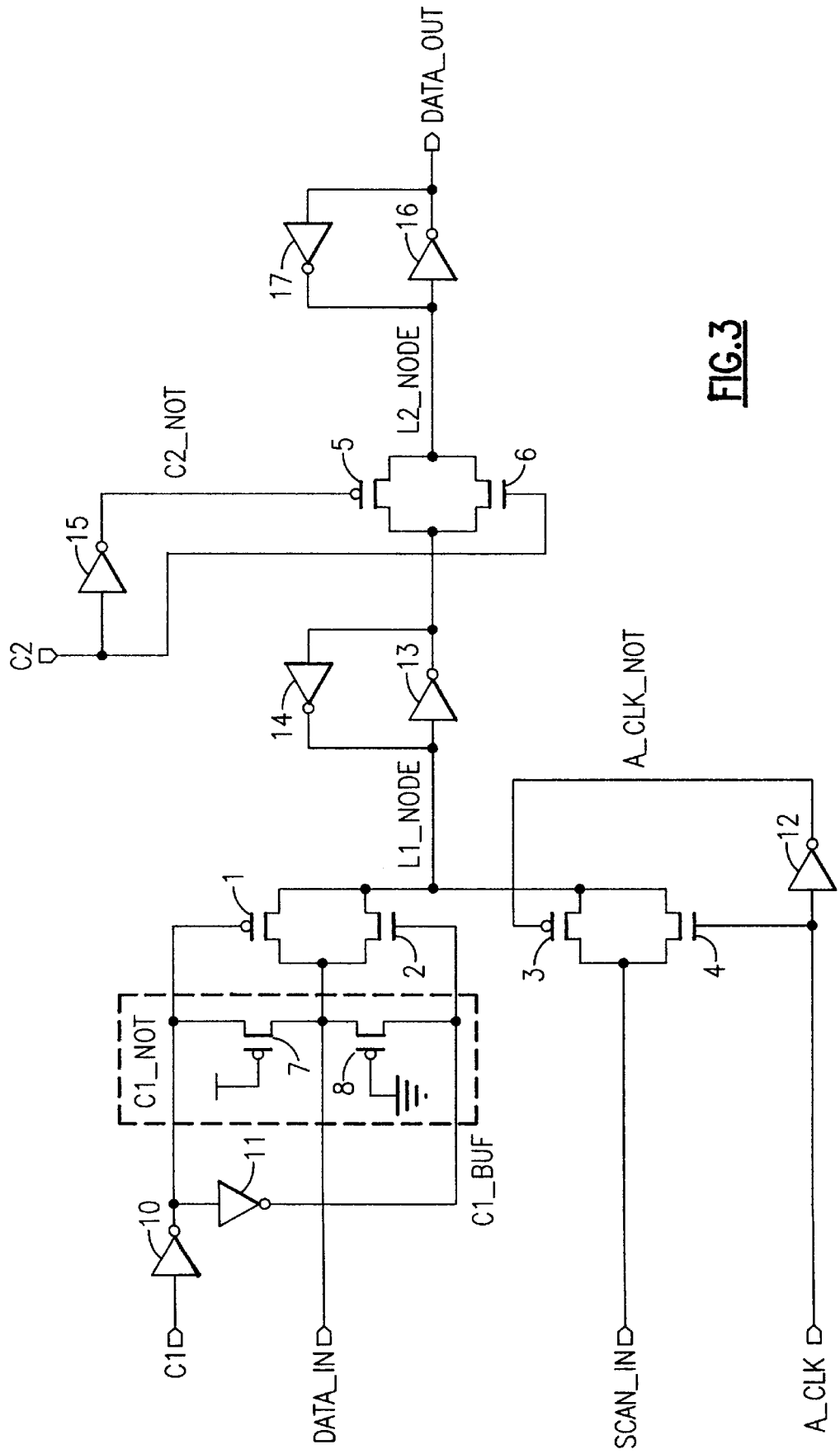
FIG. 3 illustrates our preferred latch design.

We believe that FIG. 3 illustrates a better solution which solves the coupled noise problem without increasing delay. A circuit with an additional PFET 7 to pull up the gate of the transmission PFET and an additional NFET 8 to pull down the gate of the transmission NFET is disclosed. These two FETs thus prevent the transmission gate from inadvertently opening when noise is coupled into the data_in node. These improvements are circled in FIG. 3.

The operation of the basic prior-art latch (shown in FIG. 1) is described first. When c1 (clock) is ONE, the transmission gate consisting of PFET 1 and NFET 2 is open. Data_in node voltage is passed through this transmission gate onto l1 node. This voltage is then held by cross-coupled inverters 13 and 14. When a_clk node is ONE, the transmission gate consisting of PFET 3 and NFET 4 is open. Scan_in node voltage is passed through this transmission gate onto l1_node. This voltage is then held by cross-coupled inverters 13 and 14. (C1 and a_clk are never activated simultaneously.) When c2 (clock) is ONE, the transmission gate consisting of PFET 5 and NFET 6 is open. Inverted l1_node is passed through this transmission gate onto 12_node. This node voltage is then inverted via inverter 16 to drive latch data_out node.

Consider the latch circuit when c1 clock is ZERO, i.e. the latch is supposed to be in the holding state. The node c1_not is at Vdd (logical one voltage) and the node c1_buf is at ground. If node data_in is being driven to Vdd, then coupled noise on this node could induce the source voltage of PFET 1 to rise above Vdd+Vtp. This causes PFET 1 to turn ON and the data_in voltage may now begin to charge the l1_node, destroying an l1_node zero value being held by the latch. If node data_in is being driven to ground, then coupled noise on this node could induce the source voltage of NFET 2 to drop below −Vtn. This causes NFET 2 to turn ON and the data_in voltage may now begin to discharge the l1_node, destroying an l1_node one value being held by the latch.

The operation of the buffered latch (shown in FIG. 2) is described next. The inverters 18 and 19 are added to prevent the coupled noise on node data_in from reaching the source of PFET 1 or NFET 2. Note that the inverter 19 output wire is short and thus not susceptible to coupled noise. Unfortunately these inverters add extra delay to the circuit. This translates to greater latch setup time and can impact the speed at which the design is clocked.

The operation of the disclosed latch with additional PFET 7 and NFET 8 (shown in FIG. 3) is now described. When data_in voltage is in normal range from 0 to Vdd volts both PFET 7 and NFET 8 are turned OFF and thus they do not impact the normal operation of the circuit. However in presence of noise the voltage on data_in node many stray outside this range. Noise may be generated via the switching of signals which capacitively or inductively couple into the data_in net, or noise may be generated due to Vdd and ground potential variations between the latch circuit and the circuit which drives the data_in node.

When data_in voltage rises to Vdd+Vtp, PFET 7 begins to turn ON. The c1_not node is then pulled above Vdd as the data_in voltage rises above Vdd+Vtp. Since c1_not controls the gate of PFET 1, PFET 1 is prevented from turning ON and latch state (l1_node) is preserved. When data_in voltage drops to −Vtn, NFET 8 begins to turn ON. The c1_buf node is then pulled below ground as the data_in voltage drops below −Vtn. Since c1_buf controls the gate of NFET 2, NFET 2 is prevented from turning ON and latch state at the first latch (l1_node) is preserved.

Circuit simulations performed on the basic latch of FIG. 1 demonstrate that the basic latch has approx. 650 mV of DC noise margin. Thus when data_in voltage exceeds a steady-state voltage of Vdd+650 mV, the node charges to Vdd/2 destroying latch state. And, when data_in voltage drops to a steady-state voltage of −65 OmV, the l1_node discharges to Vdd/2 destroying latch state. Circuit simulations demonstrate that the disclosed latch has approx. 1.2V of DC noise margin; it requires 1.2 volts of noise on the data_in node to destroy the latch state.

Main considerations in our latch design include:
1. (a) the relative strengths or PFETs 1 and 7;
2. (b) the relative strengths of NFETs 2 and 8;
3. (c) the relative node capacitances of c1_not and l1_node;
4. (d) the relative node capacitances of c1_buf and l1_node;
5. (e) the relative threshold voltages of PFETs 1 and 7; and
6. (f) the relative threshold voltages of NFETs 2 and 8.

To guarantee that PFET 7 turns ON before PFET 1, these PFETs should have similar strengths and the capacitance on c1_not node should be smaller than the capacitance on l1_node. This insures that PFET 7 is able to charge up c1_not before l1_node voltage begins to rise. To guarantee that NFET 8 turns ON before NFET 2, these NFETs should have similar strengths and the capacitance on c_buf node should be smaller than the capacitance on l1_node. This insures that NFET 8 is able to discharge c1_buf before l1_node voltage begins to fall. C1 and c1_buf node capacitances are kept small by implementing local inverters 10 and 11 for each individual latch. Finally, FET thresholds should track very well since they are physically close.

PFET 7 and NFET 8 add a small amount of capacitance to the data_in node. In present-day CMOS technologies, this amounts to a few additional femtofarads of capacitance which is not a significant increase in the total capacitance of the data_in node. Thus, no appreciable delay is introduced over the prior-art basic latch design.

While we have described our preferred embodiments of our invention, it will be understood that those skilled in the art, both now and in the future, may make various improvements and enhancements which fall within the scope of the claims which follow. These claims should be construed to maintain the proper protection for the invention first disclosed.

What is claimed is:

1. A noise-immune pass gate latch, comprising:
   a clock inversion circuit whose input is coupled to a clock signal and output is coupled to an inverted clock signal,
   a transmission gate circuit having a first NFET coupled to a delayed version of said clock signal and a first PFET, coupled to said inverted clock signal,
   a data input signal coupled to said first NFET and said first PFET such that voltage of said data input signal is transmitted to a latch node when said clock signal is at logic high,
   a second NFET coupled to said delayed version of said clock signal and to said data input signal whereby said second NFET is turned ON when said voltage of said data input signal drops below a first voltage threshold,
   a second PFET coupled to said inverted clock signal and to said data input signal whereby said second PFET is turned ON when said voltage of said data input signal rises above a second voltage threshold; and wherein
   the capacitance on an output node where the inverted clock signal is smaller than the capacitance on said latch node, such that said second PFET is able to raise voltage on said inverted clock signal before said first PFET begins to conduct.

2. A noise-immune pass gate latch according to claim 1 wherein said first PFET and said second PFET have a length and width sufficient to provide similar strengths.

3. A noise-immune pass gate latch according to claim 1 wherein said first NFET and said second NFET have a length and width sufficient to provide similar strengths.

4. A noise-immune pass gate latch according to claim 3 wherein capacitance on a node where said delayed version of said clock signal is smaller than the capacitance on said latch node, such that said second NFET is able to raise voltage on said delayed version of said clock signal before the said first NFET begins to conduct.

5. A noise-immune pass gate latch, comprising:
   a first clock inversion circuit whose input is coupled to a clock signal and output is coupled to an inverted clock signal,
   a second clock inversion circuit whose input is coupled to said inverted clock signal and output is coupled to a buffered clock signal,
   a transmission gate circuit having a first NFET coupled to said buffered clock signal and a first PFET coupled to said inverted clock signal,
   a data input signal coupled to said first NFET and said first PFET such that voltage of said data input signal is transmitted to a latch node when said clock signal is at logic high,
   a second NFET coupled to said buffered clock signal and to said data input signal whereby said second NFET is turned ON when said voltage of said data input signal drops below a first voltage threshold,
   a second PFET coupled to said inverted clock signal and to said data input signal whereby said second PFET is turned ON when said voltage of said data input signal rises above a second voltage threshold; and wherein
   the capacitance on a node where the inverted clock signal is smaller than the capacitance on said latch node, such that said second PFET is able to raise voltage on said inverted clock signal before said first PFET begins to conduct.

6. A noise-immune pass gate latch according to claim 5 wherein said first PFET and said second PFET have a length and width sufficient to provide similar strengths.

7. A noise-immune pass gate latch according to claim 5 wherein said first NFET and said second NFET have a length and width sufficient to provide similar strengths.

8. A noise-immune pass gate latch comprising:
(a) a first clock input terminal, a second clock input terminal, a data input terminal, and an internal latch node,
(b) a transfer circuit which couples said data input terminal to said internal latch node when said first clock input terminal is at a first logic state and said second clock input terminal is at a second logic state;
said transfer circuit comprised of a first NFET coupled to said data input terminal and said internal latch node, a first PFET coupled to said data input terminal and said internal latch node,
a second NFET which couples said data input terminal to said first clock input terminal and a second PFET which couples said data input terminal to said second clock input terminal wherein gate of said second NFET is coupled to a logic value zero and gate of said second PFET is coupled to a logic value one.

9. The noise-immune pass gate latch of claim 8, further comprising an inverter with input terminal coupled to said second clock input terminal and an output terminal coupled to said first clock input terminal.

10. The noise-immune pass gate latch of claim 9, wherein said second NFET turns on when said data input terminal drops below a first voltage threshold.

11. The noise-immune pass gate latch of claim 10, wherein said first clock input terminal is pulled down to said first voltage threshold when said second NFET turns on.

12. The noise-immune pass gate latch of claim 11, wherein said second PFET turns on when said data input terminal rises above a second voltage threshold.

13. The noise-immune pass gate latch of claim 12, wherein said second clock input terminal is pulled up to said second voltage threshold when said second PFET turns on.

14. The noise-immune pass gate latch of claim 8, wherein said second NFET turns on when said data input terminal drops below a first voltage threshold and said second PFET turns on when said data input terminal rises above a second voltage threshold.

15. The noise-immune pass gate latch of claim 14, wherein said first clock input terminal is pulled down to said first voltage threshold when said second NFET turns on and said second clock input terminal is pulled up to said second voltage threshold when said second PFET turns on.

* * * * *